United States Patent
Tanaka et al.

(10) Patent No.: US 10,347,724 B2
(45) Date of Patent: Jul. 9, 2019

(54) SILICON CARBIDE SEMICONDUCTOR DEVICE

(71) Applicant: Mitsubishi Electric Corporation, Chiyoda-ku (JP)

(72) Inventors: Rina Tanaka, Tokyo (JP); Katsutoshi Sugawara, Tokyo (JP); Yasuhiro Kagawa, Tokyo (JP); Naruhisa Miura, Tokyo (JP)

(73) Assignee: Mitsubishi Electric Corporation, Chiyoda-ku (JP)

( * ) Notice: Subject to any disclaimer, the term of this patent is extended or adjusted under 35 U.S.C. 154(b) by 0 days.

(21) Appl. No.: 15/766,424

(22) PCT Filed: Dec. 7, 2015

(86) PCT No.: PCT/JP2015/084239
§ 371 (c)(1),
(2) Date: Apr. 6, 2018

(87) PCT Pub. No.: WO2017/098547
PCT Pub. Date: Jun. 15, 2017

(65) Prior Publication Data
US 2018/0315819 A1  Nov. 1, 2018

(51) Int. Cl.
*H01L 29/423* (2006.01)
*H01L 29/16* (2006.01)
*H01L 29/08* (2006.01)
*H01L 29/10* (2006.01)
*H01L 29/417* (2006.01)
(Continued)

(52) U.S. Cl.
CPC ...... *H01L 29/1608* (2013.01); *H01L 29/0856* (2013.01); *H01L 29/1095* (2013.01);
(Continued)

(58) Field of Classification Search
CPC .................................................. H01L 29/4236
(Continued)

(56) References Cited

U.S. PATENT DOCUMENTS

2011/0012195 A1  1/2011  Momota et al.
2011/0309436 A1  12/2011  Nakata
(Continued)

FOREIGN PATENT DOCUMENTS

| JP | 5-160409 A | 6/1993 |
| JP | 2009-194065 A | 8/2009 |

(Continued)

OTHER PUBLICATIONS

International Preliminary Report on Patentability and Written Opinion dated Jun. 21, 2018 in PCT/JP2015/084239 (with English translation).

(Continued)

*Primary Examiner* — Hsin Yi Hsieh
(74) *Attorney, Agent, or Firm* — Oblon, McClelland, Maier & Neustadt, L.L.P.

(57) ABSTRACT

A gate insulating film covers a trench penetrating through a source region and a body region and reaching a drift layer in each of a first cell region and a second cell region. The gate electrode is provided in the trench. A high-concentration layer of the first conductivity type is provided between the drift layer and the body region in the first cell region and has a second impurity concentration higher than the first impurity concentration. A current restriction layer is provided between the drift layer and the body region in the second cell region and has the first conductivity type and a third impurity concentration higher than the first impurity concentration and lower than the second impurity concentration.

11 Claims, 9 Drawing Sheets

(51) Int. Cl.
*H01L 29/66* (2006.01)
*H01L 29/78* (2006.01)

(52) U.S. Cl.
CPC .... *H01L 29/41725* (2013.01); *H01L 29/4236* (2013.01); *H01L 29/66068* (2013.01); *H01L 29/7801* (2013.01); *H01L 29/7802* (2013.01)

(58) Field of Classification Search
USPC .......................................................... 257/77
See application file for complete search history.

(56) References Cited

U.S. PATENT DOCUMENTS

2011/0316071 A1  12/2011  Hatori
2016/0247910 A1  8/2016  Suzuki et al.
2016/0372460 A1  12/2016  Momota et al.

FOREIGN PATENT DOCUMENTS

| | | |
|---|---|---|
| JP | 2012-9522 A | 1/2012 |
| JP | 2012-164879 A | 8/2012 |
| JP | 2012-238887 A | 12/2012 |
| JP | 2012-253391 A | 12/2012 |
| JP | 2015-72999 A | 4/2015 |
| JP | 2015-141919 A | 8/2015 |
| JP | 2015-153893 A | 8/2015 |
| WO | WO 2010/125639 A9 | 11/2010 |

OTHER PUBLICATIONS

International Search Report dated Feb. 9, 2016 in PCT/JP2015/084239, filed on Dec. 7, 2015.

F I G. 9
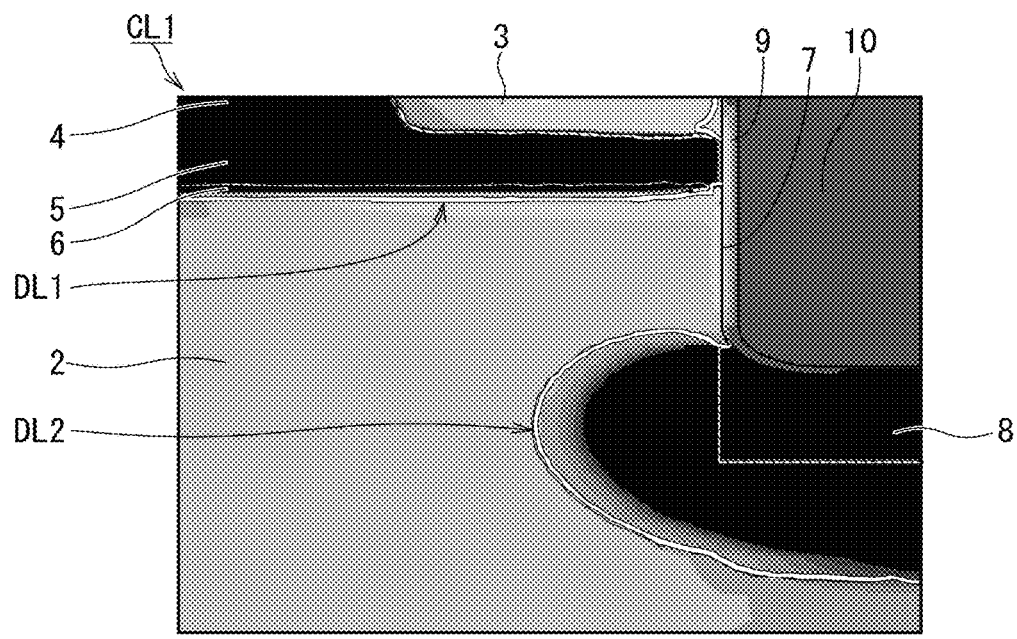
F I G. 1 0
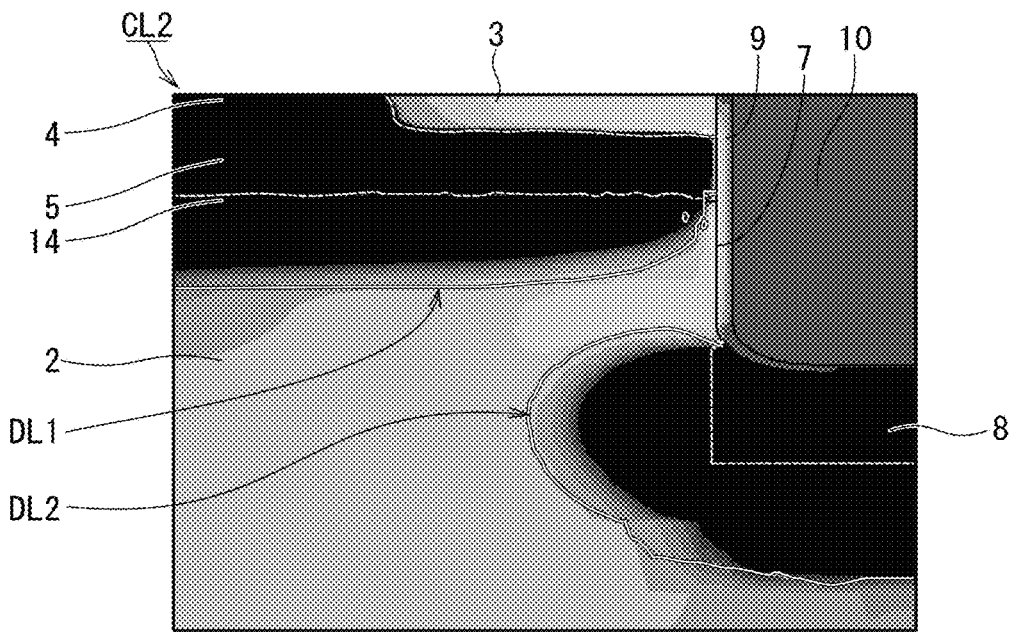

SILICON CARBIDE SEMICONDUCTOR DEVICE

TECHNICAL FIELD

The present invention relates to a silicon carbide semiconductor device and, more particularly, to a power semiconductor device having a gate electrode provided in a trench covered with a gate insulating film.

BACKGROUND ART

As a power switching element, a power metal oxide semiconductor field effect transistor (MOSFET) is widely used. MOSFETs are roughly classified into a planar type using a flat surface on a semiconductor wafer as a channel and a trench gate type using a side surface of a trench formed on a semiconductor wafer surface as a channel. In the trench gate type, reducing the cell pitch can increase the channel width density. This can restrict the ON resistance without increasing the element size. In addition, the structure of the trench gate type itself is suitable to restrict the ON resistance. For example, in a case of a planar type MOSFET having an n channel, a p-type well for the formation of a channel on an n-type drift layer is provided for each cell. One pair of adjacent p-type well sandwich an n-type drift layer to parasitically form a JFET region. In this manner, a planar type MOSFET parasitically has a JFET region between adjacent cells. A resistance component originating from a JFET region, i.e., a JFET resistance, affects the MOSFET so as to increase the ON resistance. Using a trench gate type structure can avoid the formation of a JFET region of the type described above owing to the structure. This can therefore restrict the ON resistance.

On the other hand, in the trench gate type, an electric field tends to concentrate on the bottom surface of a trench extending from the upper surface of a semiconductor wafer to its lower surface, and more intensive electric field concentration can occur due to the shape of a trench bottom portion. This makes a high electric field easily be applied to the gate insulating film on the trench bottom surface. When silicon carbide as a wide band gap semiconductor is applied as a semiconductor material, in particular, an especially high electric field can be applied to the gate insulating film. This is because the high breakdown electric field of silicon carbide is often used to obtain a high withstand voltage, and in this case, a high electric field is applied to the gate insulating film at OFF time of the MOSFET. In this case, consideration needs to be given to the securing of reliability of a gate insulating film, typically a gate oxide film.

For example, Japanese Patent Application Laid-Open No. 2012-238887 (Patent Document 1) discloses a metal oxide semiconductor field effect transistor (MOSFET) having a trench gate structure as a silicon carbide semiconductor device. This MOSFET has a p$^+$ layer in contact with an n-type drift layer on the bottom portion of a trench. This relaxes the electric field applied to a gate insulating film at OFF time of the MOSFET. The MOSFET is also provided with an n-type current diffusion layer that is formed between a p-type base layer and an n-type drift layer and has an impurity concentration higher than that of the n-type drift layer. The n-type current diffusion layer diffuses a current path in the lateral direction of an element to relax the concentration of a current path in the n-type drift layer onto near the trench. This reduces the ON resistance of the MOSFET.

PRIOR ART DOCUMENTS

Patent Documents

Patent Document 1: Japanese Patent Application Laid-Open No. 2012-238887

SUMMARY

Problem to be Solved by the Invention

As described above, a trench gate type structure is generally regarded as a structure effective in avoiding a JFET resistance. However, the present inventors have focused on the fact that even the trench gate type cannot completely eliminate the JFET resistance. When, for example, an n-channel type MOSFET is in the ON state, electrons passing through a channel formed by a p-type body region facing a trench need to pass between a portion of the trench which extends in an n-type drift layer and a depletion layer extending from the body region before diffusing into the drift layer. That is, the conduction path of electrons is narrowed. This indicates that a kind of JFET resistance exists. When a trench bottom portion is provided with a p-type trench bottom surface protective layer for electric field relaxation, in particular, a current path is narrowed between a depletion layer extending from the p-type body region and a depletion layer extending from the p-type trench bottom surface protective layer. This tends to increase the JFET resistance. As a consequence, the ON resistance of the MOSFET tends to be high.

As a method of reducing ON resistance, there is a conceivable technique of promoting the flow of current by providing a structure for widely diffusing the current into an n-type drift layer like a current diffusion layer in the technique disclosed in the above-described patent document. On the other hand, a MOSFET has a portion at which a current tends to concentrate (which will be referred to as a "current concentration portion" hereinafter). Promoting even a current flowing in such a portion can reduce the reliability of the MOSFET due to an excessive current. When, for example, a bonding wire is joined on a source pad of a semiconductor device to establish electrical connection to outside the semiconductor device, a current tends to concentrate more at a portion immediately below the bonding position of the bonding wire than at other portions. Further promoting the flow of current in this portion will locally excessively increase a current density. This can reduce the reliability of the MOSFET.

The above-described problem can occur regardless of the presence/absence of a trench bottom surface protective layer and the conductivity type of a channel. In addition, the problem can occur not only in trench gate type MOSFETs but also in other types of semiconductor devices such as trench gate type IGBTs.

The present invention has been made to solve the above-described problem and has as its object to provide a silicon carbide semiconductor device that can ensure high reliability while reducing the ON resistance.

Means to Solve the Problem

A silicon carbide semiconductor device according to one aspect of the present invention includes a silicon carbide single crystal substrate, a drift layer, a body region, a source region, a gate insulating film, a gate electrode, a high-concentration layer, a current restriction layer, a source electrode, and a drain electrode. The drift layer is provided on the silicon carbide single crystal substrate, is made of silicon carbide, and has a first conductivity type and a first impurity concentration. The body region is provided on the drift layer and has a second conductivity type different from the first conductivity type. The source region is provided on the body region and has the first conductivity type. The gate insulating film covers a trench penetrating through the source region and the body region and reaching the drift layer in each of a first cell region and a second cell region. The gate electrode is provided in the trench. The high-concentration layer is provided between the drift layer and the body region in the first cell region and has the first conductivity type and a second impurity concentration higher than the first impurity concentration. The current restriction layer is provided between the drift layer and the body region in the second cell region and has the first conductivity type and a third impurity concentration higher than the first impurity concentration and lower than the second impurity concentration. The source electrode is electrically connected to the source region. The drain electrode is electrically connected to the silicon carbide single crystal substrate.

A silicon carbide semiconductor device according to another aspect of the present invention includes a silicon carbide single crystal substrate, a drift layer, a body region, a source region, a gate insulating film, a gate electrode, a high-concentration layer, a source electrode, and a drain electrode. The drift layer is provided on the silicon carbide single crystal substrate, is made of silicon carbide, and has a first conductivity type and a first impurity concentration. The body region is provided on the drift layer and has a second conductivity type different from the first conductivity type. The source region is provided on the body region and has the first conductivity type. The gate insulating film covers a trench penetrating through the source region and the body region and reaching the drift layer in each of a first cell region and a second cell region. The gate electrode is provided in the trench. The high-concentration layer is provided between the drift layer and the body region in the first cell region and has the first conductivity type and a second impurity concentration higher than the first impurity concentration. The source electrode is electrically connected to the source region. The drain electrode is electrically connected to the silicon carbide single crystal substrate. In the second cell region, the body region is in direct contact with the drift layer.

Effects of the Invention

According to the silicon carbide semiconductor device in one aspect of the present invention, in the first cell region, the high-concentration layer of the first conductivity type is provided between the drift layer of the first conductivity type and the body region to widely diffuse a current path in the drift layer. This reduces the ON resistance. On the other hand, in the second cell region, the current restriction layer of the first conductivity type is provided between the drift layer and the body region. The impurity concentration of the current restriction layer is lower than that of the high-concentration layer. For this reason, in the second cell region, a depletion layer tends to extend from the body region of the second conductivity type. As a consequence, the current path in the drift layer is narrowed to increase the resistance of the current path in the second cell region. This restricts a current flowing in the second cell region. Accordingly, disposing the second cell region so as to enclose the current concentration portion can restrict variations in current distribution in the semiconductor device. This can restrict a current in the current concentration portion where it is especially feared that a deterioration in reliability will occur. With the above-described arrangement, a silicon carbide semiconductor device that can ensure high reliability while reducing the ON resistance can be obtained.

According to the silicon carbide semiconductor device in another aspect of the present invention, in the first cell region, the high-concentration layer of the first conductivity type is provided between the drift layer of the first conductivity type and the body region to widely diffuse a current path in the drift layer. This reduces the ON resistance. On the other hand, in the second cell region, the body region is in direct contact with the drift layer. For this reason, in the second cell region, a depletion layer tends to extend from the body region of the second conductivity type. As a consequence, the current path in the drift layer is narrowed to increase the resistance of the current path in the second cell region. This restricts a current flowing in the second cell region. Accordingly, disposing the second cell region so as to enclose the current concentration portion can restrict variations in current distribution in the semiconductor device. This can restrict a current in the current concentration portion where it is especially feared that a deterioration in reliability will occur. With the above-described arrangement, a silicon carbide semiconductor device that can ensure high reliability while reducing the ON resistance can be obtained.

Objects, features, aspects, and advantages of the present invention will become more apparent from the following detailed description of the invention and the accompanying drawings.

BRIEF DESCRIPTION OF DRAWINGS

FIG. 9 is a view showing a simulation result of a current density distribution in a first cell region in the first embodiment of the present invention.

FIG. 10 is a view showing a simulation result of a current density distribution in a second cell region in the first embodiment of the present invention.

DESCRIPTION OF EMBODIMENTS

Figure 1:
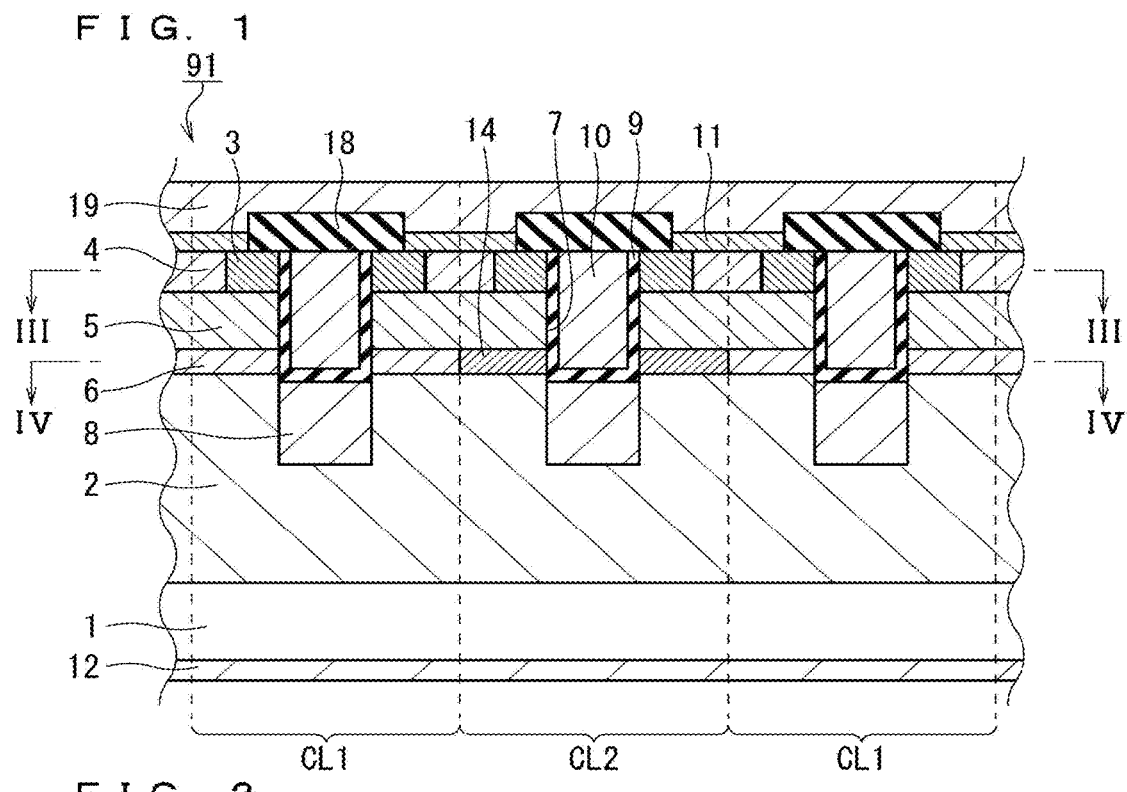
FIG. 1 is a partially sectional view taken along a line I-I in FIG. 2, schematically showing the arrangement of a silicon carbide semiconductor device according to a first embodiment of the present invention.

The embodiments of the present invention will be described below with reference to the accompanying drawings. Note that the same reference numerals denote the same or corresponding parts in the following drawings, and hence a repetitive description of the parts will be omitted.

First Embodiment

Figure 2:
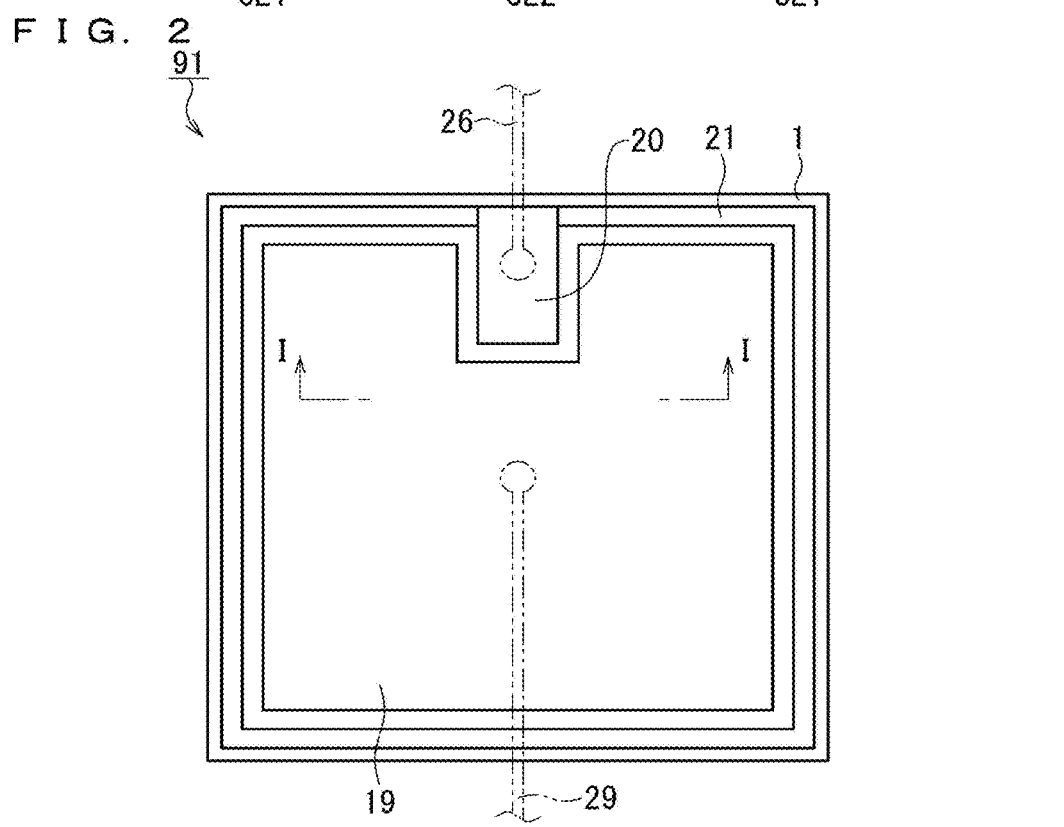
FIG. 2 is a top view schematically showing the arrangement of the silicon carbide semiconductor device according to the first embodiment of the present invention.
Figure 3:
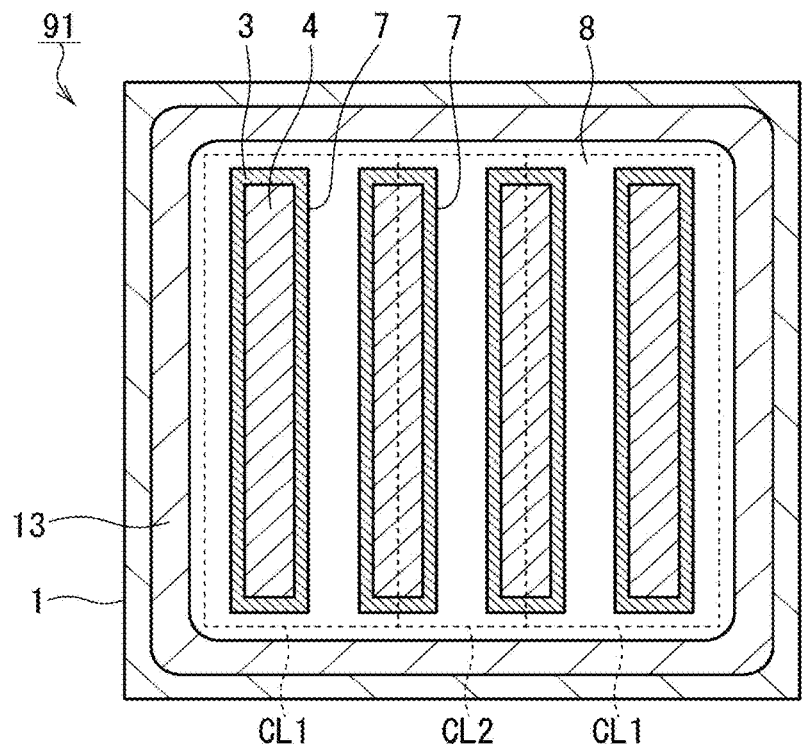
FIG. 3 is a sectional view schematically showing an arrangement along a line III-III in FIG. 1 while omitting the illustration of gate insulating films and gate electrodes in trenches.
Figure 4:
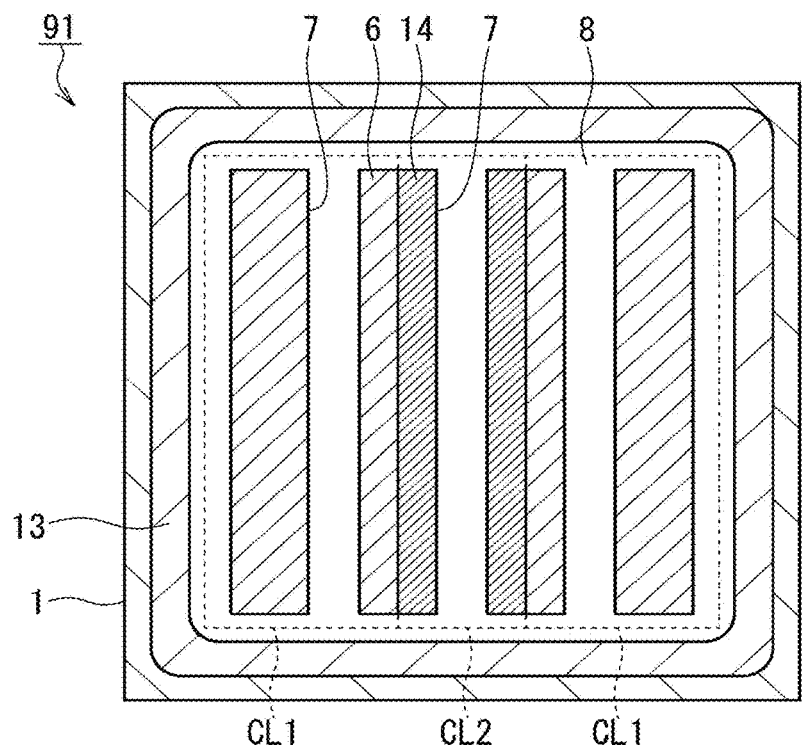
FIG. 4 is a sectional view schematically showing an arrangement along a line IV-IV in FIG. 1 while omitting the illustration of gate insulating films and gate electrodes in trenches.

FIG. 1 is a partially sectional view taken along a line I-I in FIG. 2, schematically showing the arrangement of a MOSFET 91 (silicon carbide semiconductor device) according to this embodiment. FIG. 2 is a top view schematically showing the arrangement of the MOSFET 91. Note that FIG. 2 also shows bonding wires 26 and 29 for electrically external connection of the MOSFET 91. FIGS. 3 and 4 are schematic sectional views respectively taken along a line III-III and a line IV-IV in FIG. 1. Note that FIGS. 3 and 4 omit the illustration of gate insulating films 9 and gate electrodes 10 in trenches 7 so as to make the views easily viewable.

The MOSFET 91 according to this embodiment includes a substrate 1 (silicon carbide single crystal substrate), a drift layer 2, source regions 3, body contact regions 4, body regions 5, high-concentration layers 6, trench bottom surface protective layers 8, the gate insulating films 9, the gate electrodes 10, source electrodes 11, a drain electrode 12, current restriction layers 14, interlayer dielectric films 18, a source pad 19, a gate pad 20, and a gate wiring 21. The drift layer 2, the body regions 5, the source regions 3, the body contact regions 4, the trench bottom surface protective layers 8, the high-concentration layers 6, and the current restriction layers 14 constitute a silicon carbide layer disposed on the substrate 1.

The substrate 1 and the silicon carbide layer formed on it have an active region as a region in which first cell regions CL1 and a second cell region CL2 are arranged. The second cell region CL2 is disposed so as to enclose at least one current concentration portion, and the first cell regions CL1 are arranged in other portions. The first cell regions CL1 and the second cell region CL2 each have a MOS structure.

A termination region 13 is provided on the outside of the active region. The termination region 13 preferably surrounds the active region. The termination region 13 can be formed from a p-type impurity layer formed on a surface of the drift layer 2 or the bottom surfaces of the trenches provided in the drift layer 2.

The trenches 7 are provided on a surface (the upper surface in FIG. 1) of the silicon carbide layer described above. In each of the first and second regions CL1 and CL2, the trench 7 penetrates through the source region 3 and the body region 5 and reaches the drift layer 2. In this embodiment, the trench 7 in the first cell region CL1 penetrates through the high-concentration layer 6, and the trench 7 in the second cell region CL2 penetrates through the current restriction layer 14.

The substrate 1 is of an n-type (first conductivity type). The substrate 1 is a single crystal substrate made of silicon carbide. This silicon carbide preferably has a hexagonal crystal structure; in this case, the plane direction of the main surface (the upper surface in FIG. 1) of the substrate 1 is, for example, (0001) or (03–38). The polytype of silicon carbide is, for example, 4H.

The drift layer 2 is formed on the substrate 1. The drift layer 2 is made of silicon carbide. The drift layer 2 is of the n-type and has a first impurity concentration. The first impurity concentration is typically lower than the impurity concentration of the substrate 1, preferably $1\times10^{14}$ cm$^{-3}$ or more and less than $1\times10^{17}$ cm$^{-3}$.

The body region 5 is provided on the drift layer 2. The body region 5 is of a p-type (a second conductivity type different from the first conductivity type). The acceptor impurity concentration of the body region 5 is preferably about $1\times10^{14}$ cm$^{-3}$ to $2\times10^{19}$ cm$^{-3}$. Note that the impurity concentration and thickness of the body region 5 may not be uniform.

Each source region 3 is provided on the body region 5. The source region 3 is of the n-type and has an impurity concentration higher than that of the drift layer 2. The impurity concentration of the source region 3 is, for example, about $1\times10^{19}$ cm$^{-3}$.

Each body contact region 4 is provided on the body region 5. The body contact region 4 is of the p-type and has an impurity concentration higher than that of the body region 5. The impurity concentration of the body contact region 4 is, for example, about $1\times10^{20}$ cm$^{-3}$.

Each trench bottom surface protective layer 8 is separated from the substrate 1 and the body region 5 and in contact with the drift layer 2 in a sectional view (FIG. 1). The trench bottom surface protective layer 8 is of the p-type. The impurity concentration of the trench bottom surface protective layer 8 is, for example, about $5\times10^{17}$ cm$^{-3}$ to $5\times10^{18}$ cm$^{-3}$. In this embodiment, the trench bottom surface protective layer 8 is in contact with the bottom surface of the trench 7.

The high-concentration layer 6 is provided between the drift layer 2 and the body region 5 in the first cell region CL1. The high-concentration layer 6 is of the n-type and has an impurity concentration higher than that of the drift layer 2 (a second impurity concentration higher than the first impurity concentration). The second impurity concentration is preferably $1 \times 10^{17}$ cm$^{-3}$ or more and $1 \times 10^1$ cm$^{-3}$ or less. In this embodiment, the high-concentration layer 6 is disposed at a position shallower than the bottom surface of the trench bottom surface protective layer 8 and in contact with a bottom portion of the body region 5. In addition, the high-concentration layer 6 is provided in the entire first cell region CL1 and partially penetrated by the trench 7.

The current restriction layer 14 is provided between the drift layer 2 and the body region 5 in the second cell region CL2 and in contact with the drift layer 2. The current restriction layer 14 is also in contact with a side surface of the trench 7. The current restriction layer 14 is of the n-type and has an impurity concentration higher than that of the drift layer 2 and lower than that of the high-concentration layer 6 (a third impurity concentration higher than the first impurity concentration and lower than the second impurity concentration).

Each gate insulating film 9 covers the inner surface of the trench 7. A gate electrode 10 is provided in the trench 7 covered with the gate insulating film 9. The source electrode 11 is in contact with each of the source region 3 and the body contact region 4. With this structure, the source electrode 11 is electrically connected to each of the source region 3 and the body contact region 4. The drain electrode 12 is provided on the reverse surface (the lower surface in FIG. 1) of the substrate 1 so as to be in contact with the reverse surface of the substrate 1. With this structure, the drain electrode 12 is electrically connected to the substrate 1.

The second cell region CL2 includes a portion where the substrate 1 and the body region 5 are joined to each other by only an n-type semiconductor having an impurity concentration lower than that of the high-concentration layer 6 (second impurity concentration) in the depth direction (the longitudinal direction in FIG. 1). More specifically, the second cell region CL2 includes a portion where the substrate 1 and the body region 5 are joined to each other by only the drift layer 2 and the current restriction layer 14 without through the high-concentration layer 6 in the depth direction.

The source pad 19 is provided on the source electrode 11 so as to be electrically connected to the source electrode 11. The bonding wire 29 (wiring portion) is connected to the source pad 19. The gate wiring 21 is provided on the gate electrode 10 (FIG. 1). The gate pad 20 (FIG. 2) is joined to the gate wiring 21 so as to be electrically connected to the gate electrode 10. The bonding wire 26 is connected to the gate pad 20.

Each trench 7 may be provided in a stripe shape (see FIGS. 3 and 4). In this case, a region including the source region 3 and the body contact region 4 is also provided in a stripe shape, and the body region 5 is provided so as to overlap the lower portion of the region. The trench bottom surface protective layers 8 are provided in the same pattern as that of the trenches 7. Note that the trenches 7 may be provided in a lattice shape (see FIGS. 11 and 12 to be described later). In this case, each region including the source region 3 and the body contact region 4 is provided in an island shape. These islands need not necessarily be aligned with each other. The shape of each island is not limited to a square shape and may be another type of polygonal shape. In addition, the corners of the polygonal shape may have curvatures.

A method of manufacturing the MOSFET 91 will be described next. FIGS. 5 to 8 are partially sectional views schematically showing the first to fourth steps.

Figure 5:
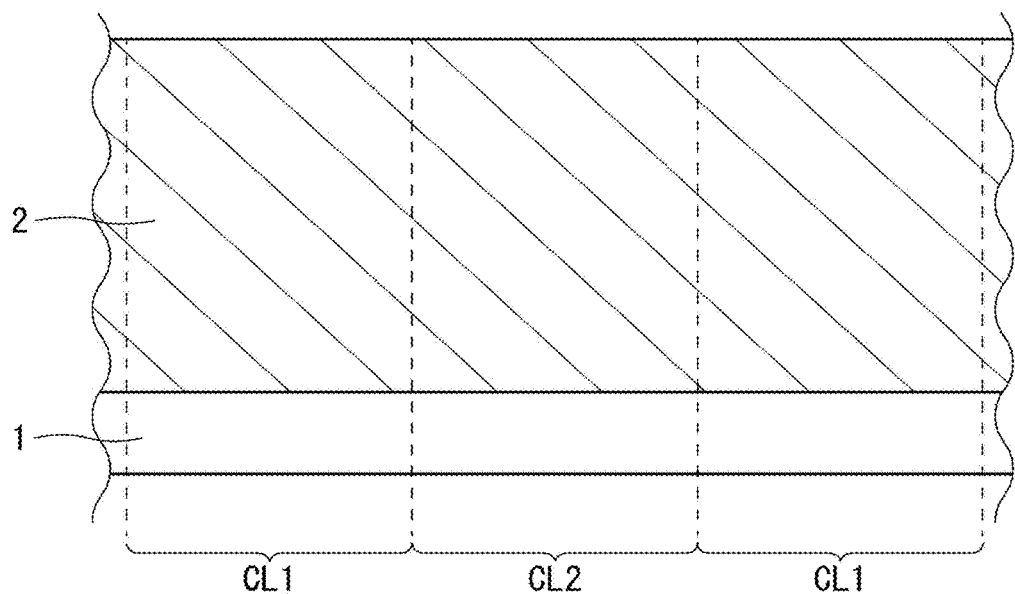
FIG. 5 is a partially sectional view schematically showing a first step in a method of manufacturing the silicon carbide semiconductor device according to the first embodiment of the present invention.
Figure 6:
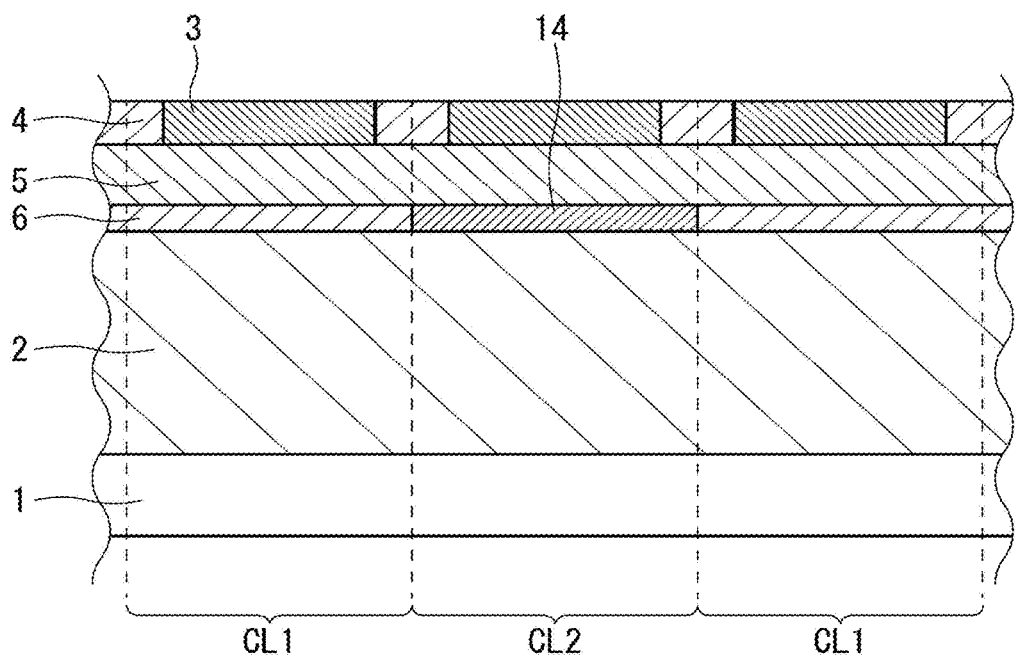
FIG. 6 is a partially sectional view schematically showing a second step in the method of manufacturing the silicon carbide semiconductor device according to the first embodiment of the present invention.

Referring to FIG. 5, a silicon carbide layer including a portion serving without being processed as the drift layer 2 is directly formed on the main surface of the substrate 1 by an epitaxial growth method. Referring to FIG. 6, the source regions 3, the body contact regions 4, the body region 5, the high-concentration layers 6, and the current restriction layers 14 are formed on the drift layer 2. They can be formed by ion implantation onto the drift layer 2 or epitaxial growth on the drift layer 2. More specifically, each body contact region 4 is formed such that its both side surfaces are in contact with the source region 3. In the first cell region CL1, the high-concentration layer 6 is formed so as to be in contact with the entire surface of the lower portion of the body region 5, whereas in the second cell region CL2, the current restriction layer 14 is formed on at least a portion of the lower portion of the body region 5. Note that when ion implantation is used, the formation order of the respective regions is not specifically limited.

Figure 7:
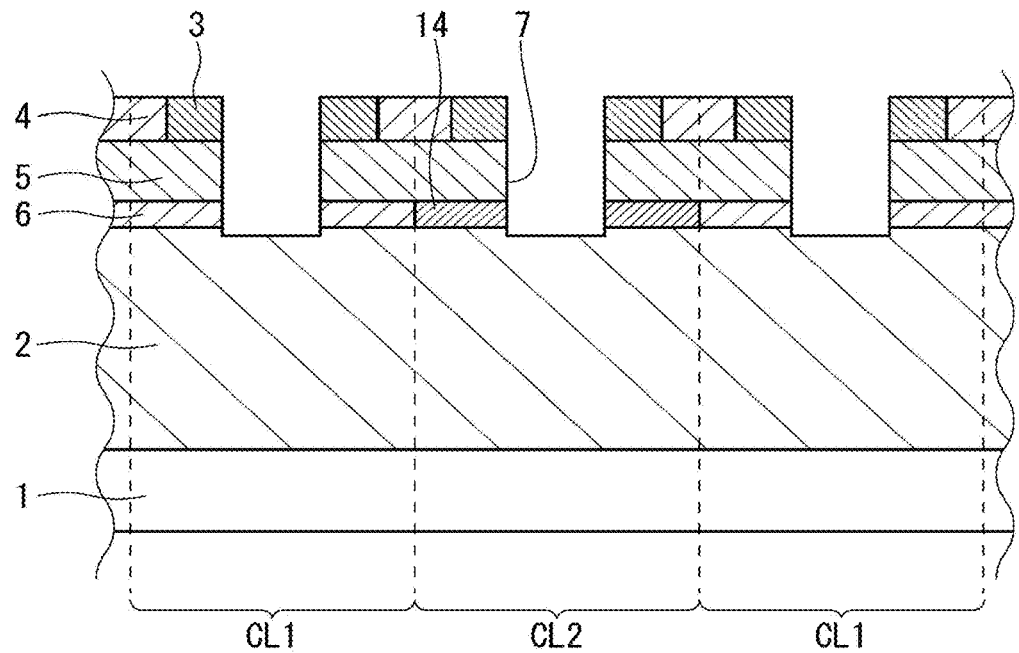
FIG. 7 is a partially sectional view schematically showing a third step in the method of manufacturing the silicon carbide semiconductor device according to the first embodiment of the present invention.
Figure 8:
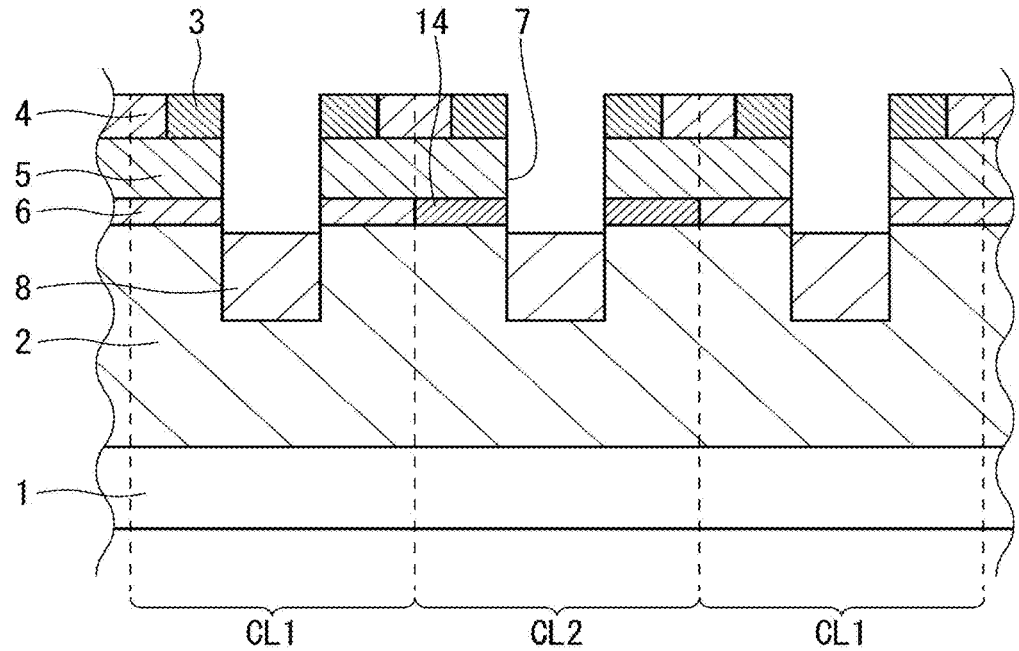
FIG. 8 is a partially sectional view schematically showing a fourth step in the method of manufacturing the silicon carbide semiconductor device according to the first embodiment of the present invention.

Referring to FIG. 7, each trench 7 is formed by etching the silicon carbide layer. Referring to FIG. 8, the trench bottom surface protective layer 8 is formed on the bottom surface of the trench 7 by the ion implantation method. Note that epitaxial growth may be performed in the trench 7 instead of ion implantation. In this case, the trench 7 is formed deeper by the thickness of the trench bottom surface protective layer 8 to be formed by epitaxial growth.

Referring to FIG. 1 again, the gate insulating film 9 is formed in each trench 7, and the gate electrode 10 is then formed. The interlayer dielectric film 18 is formed. The source electrode 11 is formed so as to be in contact with an upper portion of the source region 3 and an upper portion of the body contact region 4. The source pad 19, the gate pad 20, and the gate wiring 21 (FIG. 2) are formed. The drain electrode 12 is formed on the reverse surface of the substrate 1. As described above, the MOSFET 91 is obtained.

Note that each trench bottom surface protective layer 8 may be disposed away from the bottom surface of the corresponding trench 7. In addition, the trench bottom surface protective layer 8 need not necessarily have the same pattern as that of the trench 7. For example, even when the trench bottom surface protective layer 8 is disposed below the body contact region 4 or the body region 5 instead of below the trench 7, the effect of protecting the bottom surface of the trench 7 can be obtained. The trench bottom surface protective layer 8 like that described above may be formed, for example, by ion implantation using an implantation mask having a predetermined pattern or by epitaxial growth, before the formation of the source region 3, the body contact region 4, the body region 5, the high-concentration layer 6, and the current restriction layer 14. Note that in such a case, the trench bottom surface protective layer 8 may be connected to the body region 5 or formed away from it. That is, in a sectional view (in a field of view corresponding to FIG. 1), the effect of protecting the bottom surface of the trench 7 can be obtained by forming the p-type trench bottom surface protective layer 8 in the drift layer 2 at a position deeper than at least the body region 5, more preferably a position deeper than the gate insulating film 9 provided in a bottom portion of the trench 7.

An example of the placement of the first cell regions CL and the second cell region CL2 in the active region will be described next. As described above, the second cell region CL2 is disposed so as to enclose at least one current concentration portion. Assuming that the same structure as that of the first cell region CL is disposed in the second cell region CL2, the current concentration portion is a portion where it is feared that current concentration may degrade the reliability of the MOSFET 91. In order to improve the reliability, it is necessary to restrict a current flowing in the current concentration portion. For this purpose, the second cell region CL2 is disposed to enclose the current concentration portion. On the other hand, in portions other than the current concentration portion which can pose problems, preferably the first cell regions CL1 are arranged as many as possible from the viewpoint of reducing the ON resistance.

Assuming that a short-circuit failure can occur so as to cause the source electrode 11 and the drain electrode 12 to be electrically connected to each other, a portion immediately below the connection position between the source pad 19 and the bonding wire 29 can be one of current concentration portions. At the time of a short-circuit failure, element breakdown can occur due to the heat generated when a source current concentrates on this portion. In order to prevent such a phenomenon, the bonding wire 29 is preferably connected to the source pad 19 in the second cell region CL2 instead of the first cell region CL. In other words, a portion located immediately below the connection portion between the bonding wire 29 and the source pad 19 is preferably the second cell region CL2. This restricts a current in the current concentration portion immediately below the connection portion between the source pad 19 and the bonding wire 29, thus preventing element breakdown like that described above.

A portion near each corner portion of the substrate 1, the source pad 19, or the gate pad 20 can be a current concentration portion due to the shape of the portion. Disposing the second cell region CL2 in this current concentration portion can improve the reliability of the MOSFET 91. Accordingly, the gate pad 20 preferably has a corner portion disposed in the second cell region CL2. In addition, the source pad 19 preferably has a corner portion disposed in the second cell region CL2.

As described above, current concentration portions depend on the structure of the MOSFET 91 or its usage. Hence, the placement of the first cell regions CL1 and the second cell region CL2 is not limited to that shown in FIGS. 3 and 4.

FIGS. 9 and 10 respectively show simulation results of current density distributions in the first cell region CL1 and the second cell region CL2 in this embodiment. Referring to the figures, brighter regions indicate regions with higher current densities, and darker regions indicate regions with lower current densities. In addition, the white broken lines indicate pn junction surfaces. The white solid lines indicate depletion-layer ends DL1 and DL2 extending toward the drift layer 2. In the simulations, the impurity concentration of the high-concentration layer 6 in the first cell region CL1 was set to $5 \times 10^{17}$ cm$^{-3}$, and the impurity concentration of the current restriction layer 14 in the second cell region CL2 was set to $1.5 \times 10^{17}$ cm$^{-3}$.

The simulation results indicated that, in the first cell region CL1, the depletion-layer end DL1 extending from the body region 5 retained in the high-concentration layer 6 without entering the drift layer 2, although the current path was narrowed due to the depletion-layer end DL2 extending from the trench bottom surface protective layer 8 into the drift layer 2. In contrast to this, in the second cell region CL2, also the depletion-layer end DL1 extending from the body region 5 entered the drift layer 2, and the current path was narrowed due to the depletion-layer ends DL1 and DL2. That is, the degree of narrowing of the current path in the second cell region CL2 was higher than in the first cell region CL1. In addition, the ON resistances of the first cell region CL1 and the second cell region CL2 were respectively 2.3 mΩcm$^2$ and 2.6 mΩcm$^2$. That is, the ON resistance of the second cell region CL2 was higher that of the first cell region CL1. In addition, the saturation current value in the second cell region CL2 was about half that in the first cell region CL1. The above-described simulation results revealed that a current was restricted in the second cell region CL2 more than in the first cell region CL1.

According to this embodiment, in the first cell region CL1, a current path in the drift layer 2 is diffused by providing the n-type high-concentration layer 6 between the n-type drift layer 2 and the p-type body region 5. This reduces the ON resistance.

On the other hand, in the second cell region CL2, the n-type current restriction layer 14 is provided between the drift layer 2 and the body region 5. The impurity concentration of the current restriction layer 14 is lower than that of the high-concentration layer 6. For this reason, in the second cell region CL2, a depletion layer tends to extend from the p-type body region 5. Accordingly, the current path in the drift layer 2 is narrowed to increase the resistance of the current path in the second cell region CL2. This restricts a current flowing in the second cell region CL2. Accordingly, enclosing the current concentration portion with the second cell region CL2 can restrict variations in current distribution in the MOSFET 91. This can restrict a current in the current concentration portion where it is especially feared that a deterioration in reliability will occur.

With the above-described arrangement, the MOSFET 91 that can ensure high reliability while reducing the ON resistance is obtained.

From another viewpoint, the second cell region CL2 has a portion where the substrate 1 and the body region 5 are joined to each other by only an n-type semiconductor having an impurity concentration lower than that of the high-concentration layer 6 in the depth direction. More specifically, the second cell region CL2 includes a portion where the substrate 1 and the body region 5 are joined to each other by only the drift layer 2 and the current restriction layer 14 without through the high-concentration layer 6 in the depth direction. In this portion, because there is no portion having a high impurity concentration, a depletion layer tends to extend from the body region 5. Accordingly, the current path in the drift layer 2 is narrowed to increase the resistance of the current path in the second cell region CL2. This restricts a current flowing in the second cell region CL2. Accordingly, enclosing the current concentration portion with the second cell region CL2 can restrict variations in current distribution in the MOSFET 91. This can restrict a current in the current concentration portion where it is especially feared that a deterioration in reliability will occur.

First, providing the trench bottom surface protective layer 8 relaxes an electric field applied to the bottom portion of the trench 7. This prevents the breakdown of the gate insulating film 9 at the bottom portion of the trench 7. Second, because a depletion layer extends not only from the body region 5 but also from the bottom surface of the trench 7, a current path can be effectively narrowed in the second cell region CL2. With the above-described arrangement, the reliability of the MOSFET 91 is further improved.

Disposing the high-concentration layer 6 at a position shallower than the bottom surface of the trench bottom surface protective layer 8 increases a current in the first cell region CL1 provided with the high-concentration layer 6. Conversely, a current in the second cell region CL2 further decreases. This can further effectively restrict variations in current distribution in the semiconductor device by using the placement of the first cell regions CL1 and the second cell region CL2.

Providing the current restriction layer 14 can control the resistance of a current path in the second cell region CL2 by adjusting its impurity concentration. This can further sufficiently restrict variations in current distribution in the semiconductor device by using the placement of the first cell regions CL and the second cell region CL2.

Since the high-concentration layer 6 is in contact with the bottom portion of the body region 5, the resistance of a current path in the first cell region CL1 can be further reduced. This can further reduce the ON resistance. In addition, because a current preferentially flows into the first cell region CL1, a current flowing in the second cell region CL2 can be restricted.

Since the bonding wire 29 (FIG. 2) is connected to the source pad 19 in the second cell region CL2, a current concentration portion originating from the connection of the bonding wire 29 is included in the second cell region CL2. This can reduce or cut off a current in a current concentration portion originating from the connection of the bonding wire 29. This can further improve the reliability of the MOSFET 91.

Disposing the corner portions of the gate pad 20 or the source pad 19 in the second cell region CL2 can reduce or cut off a current in a current concentration portion originating from the presence of the corner portions of the gate pad 20 or the source pad 19. This can further improve the reliability of the MOSFET 91.

Although in this embodiment, the high-concentration layer 6 is in contact with the bottom surface of the body region 5 (FIG. 1), the high-concentration layer 6 may be disposed below away from the body region 5. The high-concentration layer 6 may be disposed below the bottom portion of the trench 7. Disposing the upper surface of the high-concentration layer 6 below the body region 5 and above the bottom portion of the trench bottom surface protective layer 8 can effectively reduce the resistance of a JFET region sandwiched between the trench bottom surface protective layer 8 and the body region 5. In order to most effectively reduce the resistance of the JFET, the high-concentration layer 6 may be formed in a depth region between the bottom portion of the body region 5 and the bottom portion of the trench bottom surface protective layer 8. In this case, a region which is above a bottom portion of the trench 7 and has an impurity concentration higher than that of the drift layer 2 below the trench bottom surface protective layer 8 corresponds to the high-concentration layer 6.

Note that when the high-concentration layer 6 is formed deeper than the upper surface of the trench bottom surface protective layer 8, it is possible to reduce not only the resistance of the JFET region between the trench bottom surface protective layer 8 and the body region 5 but also the resistance of the JFET region between the trench bottom surface protective layers 8 adjacent to each other in a sectional view.

As the high-concentration layer 6 is formed thicker within the above-described range, the JFET resistance is reduced to reduce the ON resistance; this, however, tends to cause breakdown in a current concentration portion. This embodiment can prevent such breakdown.

Note that when the high-concentration layer 6 is formed deep to a portion below the bottom portion of the trench bottom surface protective layer 8, the function of holding the voltage of the drift layer 2 deteriorates, resulting in a reduction in the withstand voltage of the MOSFET 91. For this reason, the high-concentration layer 6 is preferably formed in a region at the same depth as or shallower than the bottom portion of the trench bottom surface protective layer 8.

The suitable position range of the high-concentration layer 6 in the depth direction applies also to the current restriction layer 14. That is, the current restriction layer 14 is preferably located below the body region 5 and above the bottom portion of the trench bottom surface protective layer 8.

Second Embodiment

Figure 11:
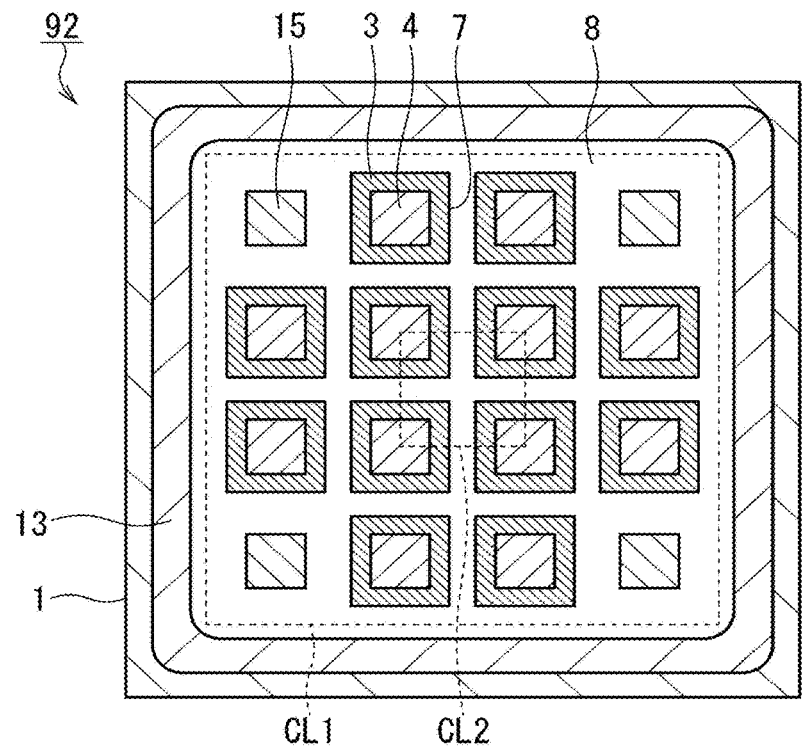
FIG. 11 is a sectional view schematically showing the arrangement of a silicon carbide semiconductor device according to a second embodiment of the present invention along a cross section similar to that shown in FIG. 3, while omitting the illustration of gate insulating films and gate electrodes in trenches.
Figure 12:
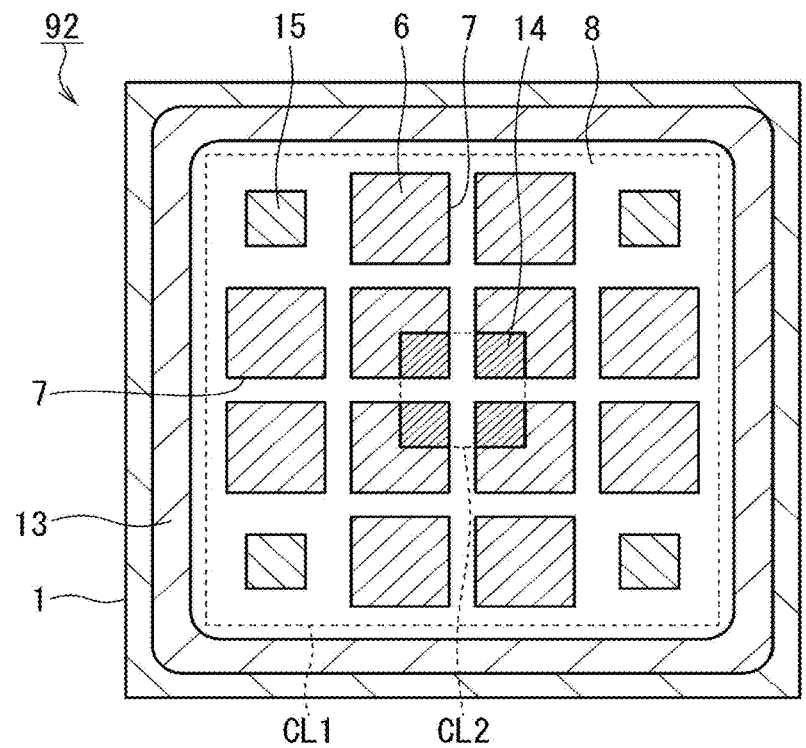
FIG. 12 is a sectional view schematically showing the arrangement of the silicon carbide semiconductor device according to the second embodiment of the present invention along a cross section similar to that shown in FIG. 4, while omitting the illustration of gate insulating films and gate electrodes in trenches.

FIGS. 11 and 12 are sectional views schematically showing the arrangement of a MOSFET 92 (silicon carbide semiconductor device) according to this embodiment in similar fields of view as those in FIGS. 3 and 4 (the first embodiment). Note that like FIGS. 3 and 4, FIGS. 11 and 12 omit the illustration of gate insulating films 9 and gate electrodes 10 in trenches 7 so as to make the views easily viewable.

The MOSFET 92 has protective-layer ground electrodes 15 in contact with a trench bottom surface protective layer 8 at the bottom surfaces of the trenches 7. This embodiment is provided with a source pad 19 (FIG. 1) in contact with source electrodes 11 (FIG. 1) and protective-layer ground electrodes 15. This structure electrically connects the source electrodes 11 to the trench bottom surface protective layer 8. Note that the protective-layer ground electrodes 15 are electrically insulated to the gate electrodes 10.

The positions of current concentration portions in the MOSFET 92 can depend on the placement of the protective-layer ground electrodes 15. More specifically, current concentration occurs more easily in portions located farther from the protective-layer ground electrodes 15 at the time of a switching operation or the like. This is because a portion of the trench bottom surface protective layer 8 which is located farther from the protective-layer ground electrode 15 makes it more difficult for a depletion layer to extend from the portion at the time of a switching operation or the like. For this reason, not a first cell region CL1 but a second cell region CL2 is disposed in a portion of an active region which is located farthest from the protective-layer ground electrode 15. In other words, the maximum distance from the protective-layer ground electrode 15 to the second cell region CL2 is larger than the maximum distance from the protective-layer ground electrode 15 to the first cell region CL1. For example, in the layouts shown in FIGS. 11 and 12, because the protective-layer ground electrodes 15 are arranged in an outer peripheral portion of the active region, the second cell region CL2 is disposed in a central portion of the active region.

Note that because components other than those described above are almost the same as those of the first embodiment, the same reference numerals denote the same or corresponding elements, and a repetitive description of them will be omitted.

According to this embodiment, in a position which may be a current concentration portion because it is far from the protective-layer ground electrode 15, a current can be reduce or cut off. This can further improve the reliability of the MOSFET 92.

Third Embodiment

Figure 13:
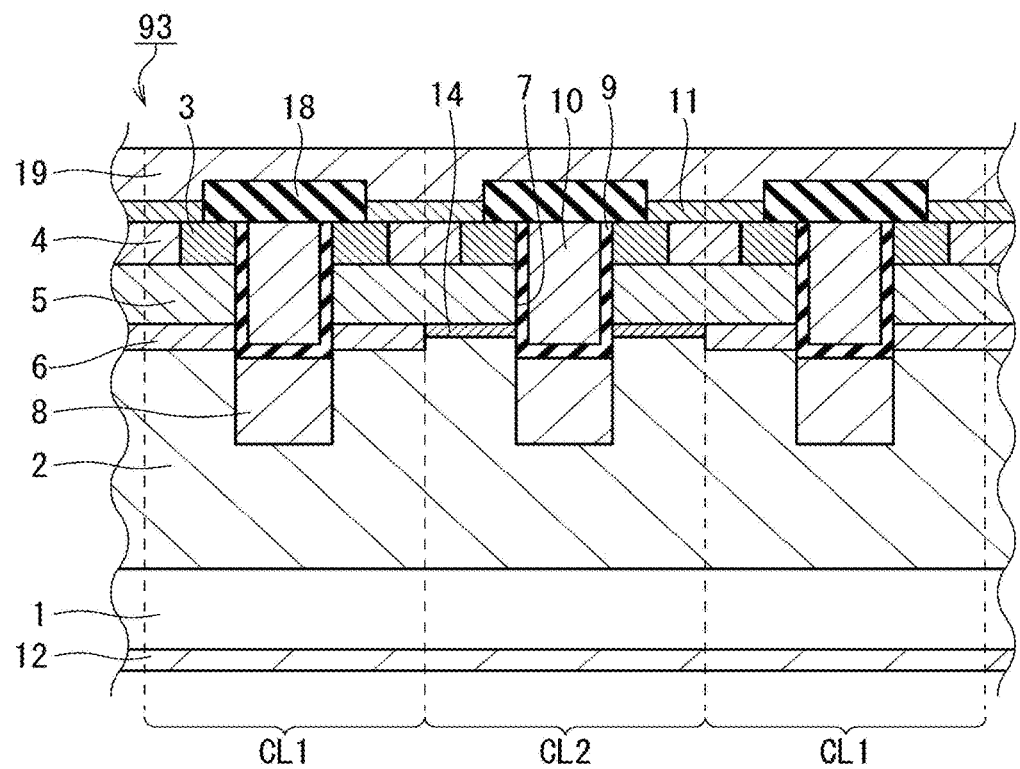
FIG. 13 is a partially sectional view schematically showing the arrangement of a silicon carbide semiconductor device according to a third embodiment of the present invention.

FIG. 13 is a partially sectional view schematically showing the arrangement of a MOSFET 93 (silicon carbide semiconductor device) according to this embodiment. In the MOSFET 93, current restriction layers 14 are thinner than high-concentration layers 6.

Each high-concentration layer 6 and each current restriction layer 14 having such different thicknesses can be obtained by forming the high-concentration layer 6 and the current restriction layer 14 individually. More specifically, an ion implantation mask having openings corresponding to the placement of the high-concentration layers 6 and an ion implantation mask having openings corresponding to the placement of the current restriction layers 14 are prepared, and ion implantation using the respective ion implantation masks is performed under different implantation conditions. The current restriction layer 14 can be formed thinner than the high-concentration layer 6 by performing ion implantation for the current restriction layer 14 to a depth shallower than for the high-concentration layer 6.

According to another method, after the current restriction layer 14 is formed in the entire active region by ion implantation, selective ion implantation may be performed using an ion implantation mask having openings corresponding to the placement of the high-concentration layers 6. Portions that have not undergone ion implantation for the high-concentration layers 6 become the final current restriction layers 14, and portions that have redundantly undergone the ion implantation become the final high-concentration layers 6. The method of forming the high-concentration layers 6 and the current restriction layers 14 is not limited to the ion implantation method, and the epitaxial growth method may be used.

According to this embodiment, the resistance of a current path in the second cell region CL2 becomes larger than when the current restriction layer 14 has the same thickness as that of the high-concentration layer 6. This can further increase the difference in resistance between the current path in a first cell region CL1 and the current path in the second cell region CL2. Accordingly, variations in current distribution in the semiconductor device can be more sufficiently restricted by using the placement of the first cell regions CL1 and the second cell region CL2. This can further improve the reliability of the MOSFET 93.

Fourth Embodiment

Figure 14:
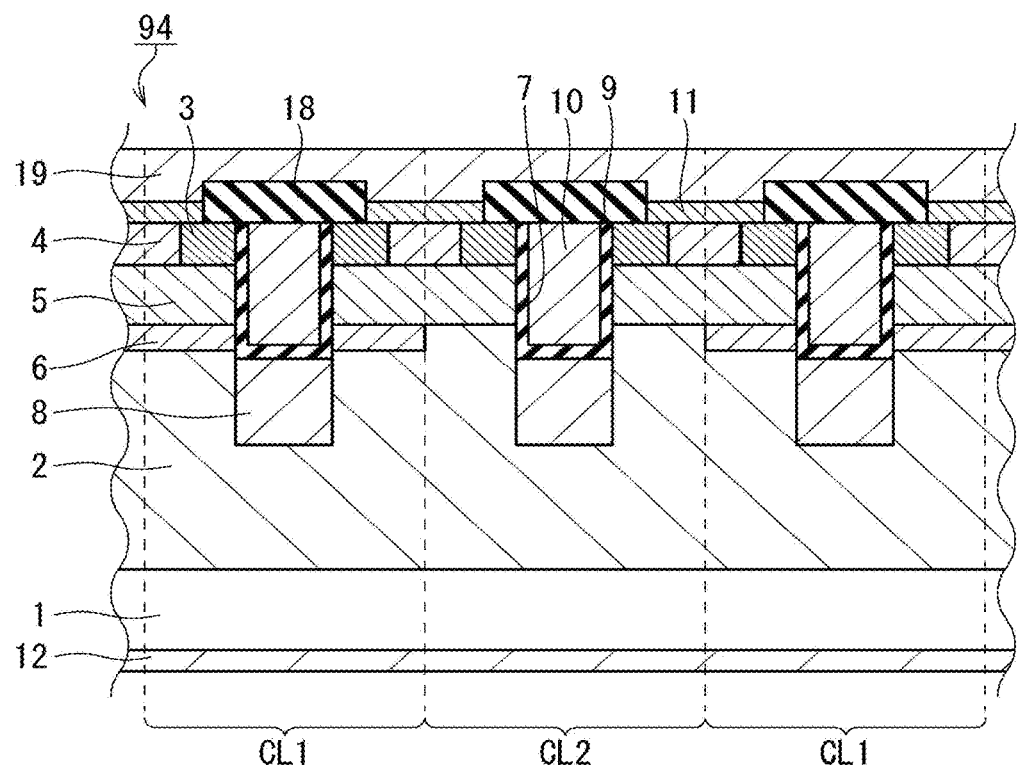
FIG. 14 is a partially sectional view schematically showing the arrangement of a silicon carbide semiconductor device according to a fourth embodiment of the present invention.

FIG. 14 is a partially sectional view schematically showing the arrangement of a MOSFET 94 (silicon carbide semiconductor device) according to this embodiment. In the MOSFET 94, a body region 5 is directly connected to a drift layer 2 in a second cell region CL2. The MOSFET 94 is not provided with the current restriction layers 14 (FIG. 1) unlike the MOSFET 91 (FIG. 1). In other words, in an active region, a portion which is between the body region 5 and a substrate 1 and made of an n-type semiconductor is formed from only the drift layer 2 and a high-concentration layer 6. In other words, the current restriction layer 14 (FIG. 1: first embodiment) is made to have the same impurity concentration as that of the drift layer 2.

Note that the second cell region CL2 is only required to include a portion where the substrate 1 and the body region 5 are joined to each other in the depth direction (the longitudinal direction in FIG. 1) by only the drift layer 2. Accordingly, it is possible to use an arrangement in which the high-concentration layer 6 partially exists also in the second cell region CL2 in a plan layout unlike the arrangement shown in FIG. 14. For example, it is possible to use an arrangement in which the high-concentration layer 6 is provided below a body contact region 4 in the depth direction but is not provided below a source region 3 in the depth direction (in other words, immediately below a channel region) in the second cell region CL2. Conversely, it is possible to use an arrangement in which the high-concentration layer 6 is not provided below the body contact region 4 in the depth direction but is provided below the source region 3 in the depth direction in the second cell region CL2.

For example, the above-described arrangement may be obtained by performing ion implantation for the formation of the high-concentration layer 6 described in the first embodiment without performing ion implantation for the formation of the current restriction layer 14. When the high-concentration layer 6 is to be formed by the epitaxial method instead of the ion implantation method, epitaxial growth accompanying doping with a high-concentration impurity may be performed in only a region provided with the high-concentration layer 6. Another method may be performed as follows: forming an epitaxial layer on the entire surface with high-concentration impurity doping, etching a portion of the epitaxial layer which is not finally provided with the high-concentration layer 6, and then performing epitaxial growth for the formation of an upper portion of a silicon carbide layer.

This embodiment is also provided with the high-concentration layer 6 to reduce the ON resistance as in the first embodiment. On the other hand, in the second cell region CL2, the body region 5 is in direct contact with the drift layer 2. For this reason, in the second cell region CL2, a depletion layer tends to extend from the p-type body region 5. Accordingly, the current path in the drift layer 2 is narrowed to increase the resistance of the current path in the second cell region CL2. This restricts a current flowing in the second cell region CL2. Accordingly, disposing the second cell region CL2 so as to include a current concentration portion can restrict variations in current distribution in the MOSFET 94. This can restrict a current in the current concentration portion where it is especially feared that a deterioration in reliability will occur. With the above-described arrangement, the MOSFET 94 that can ensure high reliability while reducing the ON resistance is obtained.

A step for forming the current restriction layers 14 (FIG. 1: first embodiment) can be omitted. This can simplify the manufacturing method.

Fifth Embodiment

This embodiment uses an arrangement similar to one of the arrangements of the MOSFETs 91 to 94, and the depth of a trench 7 is selected such that, in only a second cell region CL2 of first cell regions CL1 and the second cell region CL2, the interface between a body region 5 and the trench 7 is separated from a substrate 1 by a depletion layer when the MOSFET is in the ON state. More specifically, the trench 7 is formed to such a depth that the lower end of a depletion layer extending from a portion of the p-type body region 5 on an n-type current restriction layer 14 (FIG. 1) (in the case of the MOSFET 94 (FIG. 14) having no current restriction layer 14, a portion on a drift layer 2) is joined to the upper end of a depletion layer extending from a trench bottom surface protective layer 8, and that the lower end of a depletion layer extending from a portion of the p-type body region 5 on an n-type high-concentration layer 6 is not joined to the upper end of a depletion layer extending from the trench bottom surface protective layer 8.

The path of an ON current in each of the MOSFETs 91 to 94 passes between the p-type body region 5 and the p-type trench bottom surface protective layer 8 in the drift layer 2.

Sandwiched between the p-type regions, the current path has a JFET resistance. This increases the ON resistance. Accordingly, as the distance between the body region 5 and the trench bottom surface protective layer 8 is longer by forming the trench 7 deeper, the ON resistance decreases. Conversely, as the trench 7 is formed shallower, the ON resistance increases.

Figure 15:
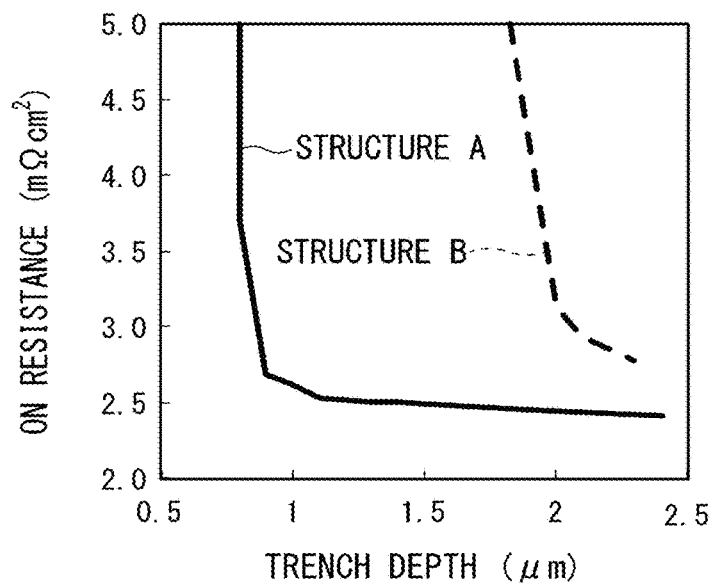
FIG. 15 is a graph showing a simulation result of the relationship between the ON resistance and the trench depth of a silicon carbide semiconductor device.

FIG. 15 is a graph showing simulation results of the relationship between ON resistance and trench depth. In this figure, "structure A" indicates the result on the MOSFET having the high-concentration layer 6, and "structure B" indicates the result on the MOSFET having no high-concentration layer 6. In structure A having the high-concentration layer 6, with a depth of about 1 μm or more, the ON resistance was kept almost constant, whereas with a depth of about 1 μm (depth $d_{min1}$) or less, the ON resistance rapidly increased. In structure B having no high-concentration layer 6, with a depth of about 2 μm (depth $d_{min2}$) or less, the ON resistance rapidly increased.

The above-described results indicate that in the MOSFET 94 having the high-concentration layers 6 in the first cell regions CL1 and having no high-concentration layer in the second cell region CL2, when each trench 7 has a depth of 1 μm or more and 2 μm or less (the depth $d_{min1}$ or more and the depth $d_{min2}$ or less), the ON resistance of the second cell region CL2 can be increased to such a degree that the second cell region CL2 can be substantially regarded being in the OFF state, while the ON resistance of each first cell region CL1 is kept sufficiently low.

Figure 16:
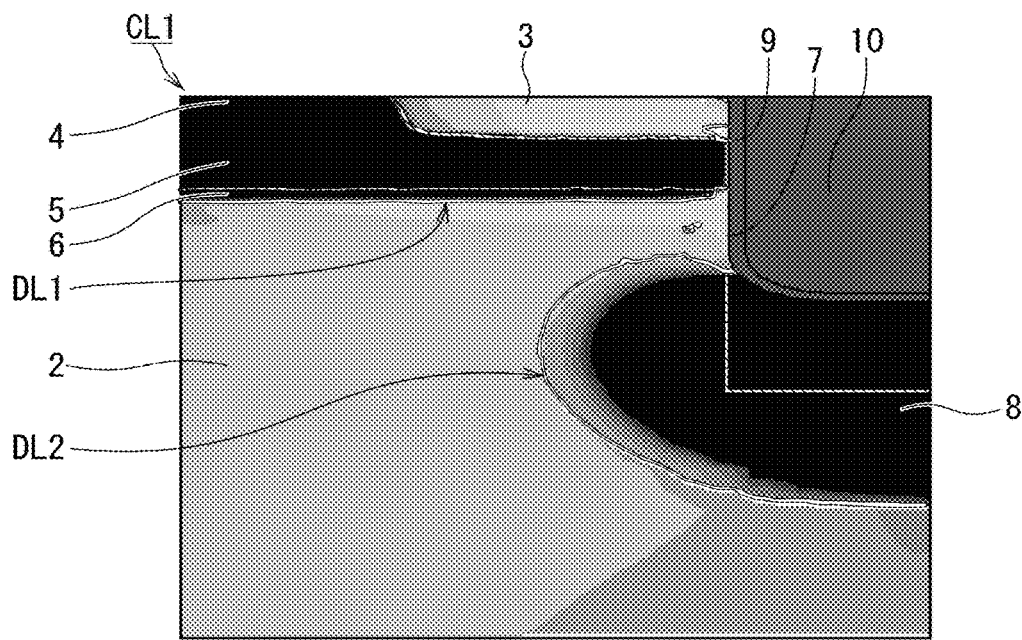
FIG. 16 is a view showing a simulation result of a current density distribution in a cell region having a high-concentration layer in a silicon carbide semiconductor device.
Figure 17:
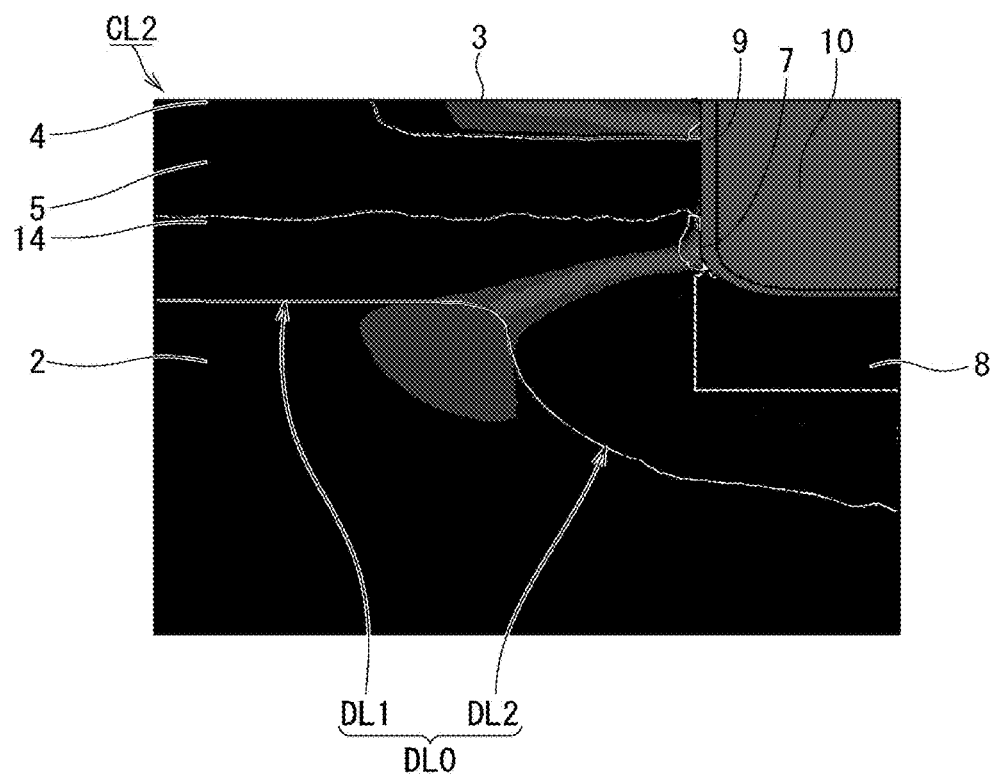
FIG. 17 is a view showing a simulation result of a current density distribution in a cell region having no high-concentration layer in a silicon carbide semiconductor device.

FIGS. 16 and 17 show the simulation results of current density distributions in the first cell regions CL1 and the second cell region CL2 in the ON state of the MOSFET 94 (FIG. 14) in which a depth d of each trench 7 is set to 1.3 Gm, which is $d_{min1}$ or more and $d_{min2}$ or less. Referring to the figures, brighter regions indicate regions with higher current densities, and darker regions indicate regions with lower current densities. In addition, the white broken lines indicate pn junction surfaces. The white solid lines indicate depletion-layer ends DL1 and DL2 extending toward the drift layer 2.

In each first cell region CL1 (FIG. 16), the depletion-layer end DL1 extended little from the body region 5, and hence a wide current path was ensured on a side surface of the trench 7. In contrast to this, in the second cell region CL2 (FIG. 17), the depletion-layer end DL1 extended greatly from the body region 5 was joined to the depletion-layer end DL2 extending from the trench bottom surface protective layer 8. In other words, a depletion-layer end DL0 as an integrated portion of the depletion-layer ends DL1 and DL2 was formed so as to cover a side surface of the trench 7 and a portion located below it. That is, in the MOSFET 94 in the ON state, a current path with a low ON resistance was formed in the first cell region CL, whereas a current path was closed in the second cell region CL2. Accordingly, it was found that setting the depth d of the trench 7 to $d_{min1} < d < d_{min2}$ while disposing the second cell region CL2 in a current concentration portion made it possible to cut off a current in the current concentration portion even while the MOSFET 94 was in the ON state.

According to this embodiment, the current path in the second cell region CL2 is cut off by the depletion layer. With this structure, disposing the second cell region CL2 so as to enclose the current concentration portion can more reliably restrict a load on the current concentration portion, where it is especially feared that a deterioration in reliability will occur. Therefore, the reliability of the MOSFETs 91 to 94 can be further improved. In the MOSFET 94, in particular, because a depletion layer can directly extend from the p-type body region 5 into the drift layer 2, a current can be more reliably cut off in the second cell region CL2.

The second cell region CL2 also has a function of relaxing an electric field applied to the first cell region CL1 adjacent to the second cell region CL2 while the MOSFET is in the OFF state. This embodiment therefore improves the reliability of the MOSFET as compared with a case in which no element structure is provided in a portion of the active region which corresponds to the second cell region CL2.

Each of the above-described embodiments has exemplified the case in which the trench bottom surface protective layers 8 are provided; however, the trench bottom surface protective layers 8 need not necessarily be provided. In the case in which the trench bottom surface protective layers 8 are not provided, a JFET resistance is generated when the current path is narrowed between a depletion layer extending from the body region 5 and a portion of the trench 7 which extends deeper than the body region 5. Such current paths can be narrowed to different degrees in the first cell regions CL1 and the second cell region CL2 by the similar method to that described in each embodiment. This makes it possible to obtain almost the same effect as that in each embodiment described above even without the trench bottom surface protective layers 8.

Although the MOSFETs have been described above, a silicon carbide semiconductor device may be a metal insulator semiconductor field effect transistor (MISFET) other than MOSFETs. In addition, a silicon carbide semiconductor device is not limited to a MISFET and may be another type of transistor device such as an insulated gate bipolar transistor (IGBT). An IGBT may be obtained by, for example, making the above-described substrate 1 have a conductivity type opposite to that of the drift layer 2, or providing a collector layer having a conductivity type opposite to that of the drift layer 2 between the substrate 1 and the drain electrode 12. In this case, the source electrode 11 and the drain electrode 12 respectively function as an emitter electrode and a collector electrode. Although the above-described description has exemplified the case in which the first and second conductivity types are respectively the n-type and the p-type, they may be reversed.

In the present invention, the respective embodiments can be freely combined and can be modified and omitted as needed within the scope of the invention. While the present invention has been described in detail, the above-described description is in all aspects illustrative and does not limit the invention. It is therefore understood that innumerable modifications that have not been exemplified can be conceived without departing from the scope of the invention.

EXPLANATION OF REFERENCE SIGNS

CL1: first cell region
CL2: second cell region
DL0, DL1, DL2: depletion-layer end
1: substrate (silicon carbide single crystal substrate)
2: drift layer
3: source region
4: body contact region
5: body region
6: high-concentration layer
7: trench
8: trench bottom surface protective layer
9: gate insulating film
10: gate electrode
11: source electrode 12: drain electrode
13: termination region
14: current restriction layer
15: protective-layer ground electrode
18: interlayer dielectric film
19: source pad
20: gate pad
26: bonding wire
29: bonding wire (wiring portion)
91-94: MOSFET (silicon carbide semiconductor device)

The invention claimed is:

1. A silicon carbide semiconductor device comprising:
a silicon carbide single crystal substrate;
a drift layer provided on the silicon carbide single crystal substrate, made of silicon carbide, and having a first conductivity type and a first impurity concentration;
a body region provided on the drift layer and having a second conductivity type different from the first conductivity type;
a source region provided on the body region and having the first conductivity type;
a source electrode electrically connected to the source region;
a gate insulating film covering a trench penetrating through the source region and the body region and reaching the drift layer in each of a first cell region and a second cell region;
a gate electrode provided in the trench;
a trench bottom surface protective layer provided in the drift layer at a position deeper than the body region in a sectional view and having the second conductivity type;
a protective-layer ground electrode configured to electrically connect the source electrode to the trench bottom surface protective layer;
a high-concentration layer provided between the drift layer and the body region in the first cell region and having the first conductivity type and a second impurity concentration higher than the first impurity concentration;
a current restriction layer provided between the drift layer and the body region in the second cell region and having the first conductivity type and a third impurity concentration higher than the first impurity concentration and lower than the second impurity concentration; and
a drain electrode electrically connected to the silicon carbide single crystal substrate,
wherein a maximum distance from the protective-layer ground electrode to the second cell region is larger than a maximum distance from the protective-layer ground electrode to the first cell region.

2. The silicon carbide semiconductor device according to claim 1, wherein a thickness of the current restriction layer is smaller than a thickness of the high-concentration layer.

3. The silicon carbide semiconductor device according to claim 1, wherein the high-concentration layer is disposed at a position shallower than a bottom surface of the trench bottom surface protective layer.

4. The silicon carbide semiconductor device according to claim 1, wherein an impurity concentration of the drift layer is not less than $1\times10^{14}$ cm$^{-3}$ and less than $1\times10^{17}$ cm$^{-3}$, and an impurity concentration of the high-concentration layer is not less than $1\times10^{17}$ cm$^{-3}$ and not more than $1\times10^{18}$ cm$^{-3}$.

5. The silicon carbide semiconductor device according to claim 1, wherein the high-concentration layer is in contact with a bottom portion of the body region.

6. The silicon carbide semiconductor device according to claim 1, wherein when the silicon carbide semiconductor device is in an ON state, an interface between the body region and the trench is separated from the silicon carbide single crystal substrate by a depletion layer only in the second cell region of the first cell region and the second cell region.

7. A silicon carbide semiconductor device comprising:
a silicon carbide single crystal substrate;
a drift layer provided on the silicon carbide single crystal substrate, made of silicon carbide, and having a first conductivity type and a first impurity concentration;
a body region provided on the drift layer and having a second conductivity type different from the first conductivity type;
a source region provided on the body region and having the first conductivity type;
a source electrode electrically connected to the source region;
a gate insulating film covering a trench penetrating through the source region and the body region and reaching the drift layer in each of a first cell region and a second cell region;
a gate electrode provided in the trench;
a trench bottom surface protective layer provided in the drift layer at a position deeper than the body region in a sectional view and having the second conductivity type;
a protective-layer ground electrode configured to electrically connect the source electrode to the trench bottom surface protective layer;
a high-concentration layer provided between the drift layer and the body region in the first cell region and having the first conductivity type and a second impurity concentration higher than the first impurity concentration; and
a drain electrode electrically connected to the silicon carbide single crystal substrate,
wherein the body region and the drift layer are in direct contact with each other in the second cell region, and a maximum distance from the protective-layer ground electrode to the second cell region is larger than a maximum distance from the protective-layer ground electrode to the first cell region.

8. The silicon carbide semiconductor device according to claim 7, wherein the high-concentration layer is disposed at a position shallower than a bottom surface of the trench bottom surface protective layer.

9. The silicon carbide semiconductor device according to claim 7, wherein an impurity concentration of the drift layer is not less than $1\times10^{14}$ cm$^{-3}$ and less than $1\times10^{17}$ cm$^{-3}$, and an impurity concentration of the high-concentration layer is not less than $1\times10^{17}$ cm$^{-3}$ and not more than $1\times10^{18}$ cm$^{-3}$.

10. The silicon carbide semiconductor device according to claim 7, wherein the high-concentration layer is in contact with a bottom portion of the body region.

11. The silicon carbide semiconductor device according to claim 7, wherein when the silicon carbide semiconductor device is in an ON state, an interface between the body region and the trench is separated from the silicon carbide single crystal substrate by a depletion layer only in the second cell region of the first cell region and the second cell region.

* * * * *